(12) United States Patent
Main et al.

(10) Patent No.: US 6,249,170 B1
(45) Date of Patent: Jun. 19, 2001

(54) LOGARITHMIC GAIN CONTROL CIRCUIT AND METHOD

(75) Inventors: William E. Main, Mesa; Danielle L. Coffing, Tempe; Jeffrey Durec, Chandler, all of AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/549,835

(22) Filed: Apr. 14, 2000

(51) Int. Cl.[7] ............................... G06F 7/556; G06F 7/24
(52) U.S. Cl. ...................... 327/350; 327/351; 327/359; 327/563
(58) Field of Search ........................... 327/350, 351, 327/359, 563, 538, 543; 330/254, 257; 323/315, 312, 316

(56) References Cited

U.S. PATENT DOCUMENTS

| | | | |
|---|---|---|---|
| 4,004,141 | * 1/1977 | Curtis | 327/350 |
| 4,379,995 | * 4/1983 | Yamada et al. | 330/254 |
| 4,818,951 | * 4/1989 | Roberts | 330/254 |
| 5,200,655 | * 4/1993 | Feldt | 327/362 |
| 5,302,868 | * 4/1994 | Fergus | 327/359 |
| 6,104,226 | * 8/2000 | Weber | 327/359 |

* cited by examiner

Primary Examiner—Terry D. Cunningham
Assistant Examiner—Long Nguyen
(74) Attorney, Agent, or Firm—Lanny L. Parker

(57) ABSTRACT

An improved logarithmic amplifier (100) and method in which a signal at an output (106) is logarithmic with respect to the voltage supplied at a gain control input (102). The logarithmic amplifier (100) includes a first amplifier stage (110) and a second amplifier stage (130) which are coupled together by a current mirror stage (120). Alternative embodiments of logarithmic amplifier (200) and (300) include different biasing methods for biasing the second amplifier stage (130).

14 Claims, 2 Drawing Sheets

LOGARITHMIC GAIN CONTROL CIRCUIT AND METHOD

This invention relates, in general, to a gain control circuit for integrated circuit amplifiers, for example Radio Frequency (RF) amplifiers in telecommunication applications such as cellular and cordless telephones. Specifically this invention relates to a logarithmic gain control circuit.

In a typical RF telecommunication application, particularly a cellular phone application, it is desirable to closely monitor and control amplifier gain to avoid excessively weak or strong transmissions. A preferred method for controlling amplifier gain is to apply a gain control voltage to an amplifier such that the ratio of the output signal current to the input signal current is a logarithmic function of the gain control voltage.

Prior art implementations attenuate a signal current by cascoding the current through an amplifier using a differential transistor pair. The differential transistor pair splits the current between the two transistors, with the collector current of one transistor as the output current and the collector current of the second transistor connected to $V_{cc}$. A differential gain control voltage applied to the bases of the transistor pair controls the attenuation of the output signal current.

The disadvantage of the prior art implementation is it fails to maintain the logarithmic relationship between the output signal current and the gain control voltage. The prior art circuits have a significant dB loss in signal output current when operated at higher gains. Therefore, a need exists to provide a gain control circuit that provides for a logarithmic relationship between the signal output current and the gain control voltage.

DETAILED DESCRIPTION OF THE DRAWINGS

Figure 1:
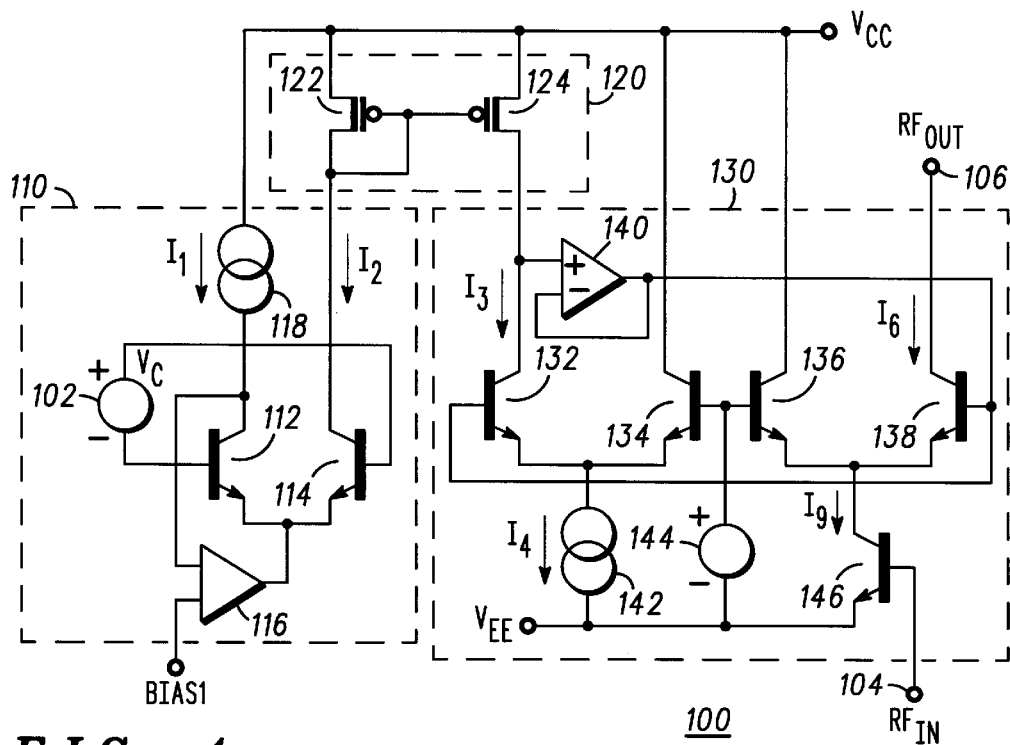
FIG. 1 is a circuit diagram of a logarithmic amplifier in accordance with the present invention.

Referring to FIG. 1, a logarithmic amplifier 100 is shown which has a gain control input for receiving the signal BIAS1, an input 104 for receiving the signal $RF_{IN}$, and an output 106 for supplying the signal $RF_{OUT}$. Gain control input 102 receives an input voltage $V_c$ that is supplied to the base terminals of a transistor differential pair defined by transistors 112 and 114. In addition to the transistor differential pair, a first amplifier stage 110 includes a transconductance amplifier 116 and a selectable current source 118. In the preferred embodiment transistors 112 and 114 are bipolar junction transistors.

The selectable current source 118 has one terminal connected to a power conductor $V_{cc}$ and another terminal connected to the collector of transistor 112. Current source 118 conducts a current $I_1$. A voltage generated at the collector of transistor 112 is supplied to one input of transconductance amplifier 116 and a biasing voltage Bias 1 is supplied to the other input of transconductance amplifier 116. The collector of transistor 114 receives a current $I_2$ supplied from a current mirror stage 120. The gain control input 102 is connected between the base terminals of transistors 112 and 114. The emitters of transistors 112 and 114 are commonly connected to each other and to the output of transconductance amplifier 116, which provides a feedback path for generating the tail current for the differential pair, i.e., transistors 112 and 114. Transconductance amplifier 116 compares the current $I_1$ provided by current source 118 with the current into the collector of transistor 112 and generates a tail current for transistors 112 and 114 that causes the two currents to be equal.

The first amplifier stage 110 is connected to a second amplifier stage 130 by the current mirror stage 120. Current mirror stage 120 includes a first current mirror transistor 122 and a second current mirror transistor 124. In the preferred embodiment, transistors 122 and 124 are P-channel Metal Oxide Semiconductor Field Effect Transistors (MOSFETs) having a control terminal (gate) and first and second current carrying terminals (drain and source terminals). Alternatively, transistors 122 and 124 could be bipolar junction transistors having a control terminal (base) and first and second current carrying terminals (collector and emitter terminals). The source terminals of transistors 122 and 124 are connected to the power conductor having the supply voltage $V_{CC}$. The gate and drain of transistor 122 are commonly connected to the collector of transistor 114 and to the gate of transistor 124. The drain of transistor 124 is connected to the second amplifier stage 130 as discussed below.

Current mirror stage 120 provides a scaling factor between the first amplifier stage 110 and the second amplifier stage 130. When the scaling factor is unity, the current $I_2$ supplied to the first amplifier stage 110 is equal to the current $I_3$ that is supplied to the second amplifier stage 130. It should be noted that the scaling factor may have values other than unity. In general, the current $I_3$ will be equal to a scaling factor multiplied by the value of the current $I_2$. In the preferred embodiment, current mirror stage 120 permits the components of the two amplifier stages (preferably the first amplifier stage 110) to be sized to optimize power dissipation while achieving the desired output current.

Second amplifier stage 130 includes two transistor differential pairs with the first transistor differential pair being defined by transistors 132 and 134. The collector of transistor 132 is connected to the drain of transistor 124 and also to an input of a buffer amplifier 140. The emitters of transistor 132 and transistor 134 are commonly connected to each other and coupled to a power conductor that receives the voltage $V_{EE}$ through a current source 142 that conducts a current $I_4$. The collector of transistor 134 is connected to the power conductor that receives the voltage $V_{CC}$. In alternative embodiments, a resistor may be located between the collector of transistor 134 and $V_{cc}$ to improve performance, particularly in RF applications.

Transistors 136 and 138 define the second transistor differential pair. The collector of transistor 136 is connected to the power conductor that receives the voltage $V_{CC}$ and the collector of transistor 138 is connected to output 106. In alternative embodiments, a resistor may be located between the collector of transistor 136 and $V_{cc}$ to improve performance, particularly in RF applications. Transistor 138 conducts a current $I_6$. The emitters of transistors 136 and 138 are connected to each other and further coupled to the power conductor that receives the voltage $V_{EE}$ through a transistor 146. The base of transistor 146 is connected to input 104 for receiving the signal $RF_{IN}$ that controls the current $I_9$ conducted by transistor 146. A biasing voltage is supplied by voltage source 144 to the bases of transistors 134 and 136.

The common connection of the bases of transistors 132 and 138 is further connected to both the non-inverting input and the output of buffer amplifier 140. The commonly connected bases of transistors 134 and 136 are coupled to the power conductor receiving the voltage $V_{EE}$ via a voltage source 144. In the preferred embodiment, the current $I_4$ conducted by current source 142 is proportional to the current $I_1$ conducted by current source 118, having the same scaling factor as designed into current mirror stage 120.

Current $I_3$ is the current conducted by transistor 132 and the voltage generated at the collector of this transistor is supplied to an input of the buffer amplifier 140. Buffer amplifier 140 provides a feedback path for generating a biasing voltage that controls the current being conducted by transistors 132 and 138. Thus, the following current ratios are established:

$$I_6/I_9 = I_3/I_4 \quad \text{(Equation 1)}$$

Equation 1 is valid because the two transistor differential pairs are symmetrical and the transistors 132, 138 and 146 are the same size. Furthermore, current $I_4$ is selected so that it is approximately equal to current $I_9$. Alternatively, the currents of equation 1 and the sizes of the respective transistors may be designed to create ratios, which provide the desired result. Note that if the scaling factor for the current mirror stage 120 is unity, then current $I_2$ is equal to current $I_3$. Thus:

$$I_6/I_9 = I_2/I_4 \quad \text{(Equation 2)}$$

However, if the scaling factor of current mirror stage 120 has a value other than unity, then the scaling factor will be applied in the selection of current $I_4$. By design, the scaling relationship of current $I_4$ to current $I_1$ is the same as the scaling relationship of current $I_3$ to current $I_2$ in current mirror stage 120, thus the scaling factors cancel. Equation 3 shows cancellation of the scaling factors:

$$I_6/I_9 = I_2/I_1 \quad \text{(Equation 3)}$$

However, the ratio of currents $I_2/I_1$, i.e., the ratio of currents in the differential pair of the first amplifier stage, is the exponential of the gain control input, $V_c$, to thermal voltage $V_T$, where $V_T = kT/q$. That is:

$$I_6/I_9 = e^{V_C/V_T} \text{ and thus,} \quad \text{(Equation 4)}$$

$$\ln(I_6/I_9) = V_C/V_T \quad \text{(Equation 5)}$$

Therefore, the ratio of the output current $I_6$ to the current $I_9$ is controlled by the signal at input 104 and is logarithmic with respect to the voltage $V_c$ at gain control input 102.

Thus, transconductance amplifier 116 supplies a tail current to transistors 112 and 114 that causes the current $I_1$ conducted by current source 118 to be equal to the current into the collector of transistor 112. The current $I_2$ conducted by transistor 114 is a function of the current $I_1$ and the control voltage VC. The current $I_2$ is mirrored by current mirror stage 120 in generating current $I_3$. Buffer amplifier 140 controls the voltage at the base of transistors 132 and 138, forcing the current $I_3$ supplied by transistor 124 to equal the current into the collector of transistor 132. The base terminals of transistors 132 and 138 receive the same voltage and the base terminals of transistors 134 and 136 receive the same voltage. This forces a ratio of the current $I_3$ to the current $I_1$ to be the same as a ratio of the current $I_6$ to the current $I_9$. By design, the current $I_1$ is chosen to equal the current $I_4$, resulting in the relationship of $(I_6/I_9) = \exp(V_c/V_t)$, where $V_t$ has a value of 26 millivolts (mv). By way of example, when $V_c$ has a value of zero, current $I_6$ is equal to the current $I_9$ and there is no attenuation. However, when $V_c$ has a value of −60 mv, the gain is exp(−60 mv/26 mv), or 20 decibels (dB) less, and when $V_c$ has a value of −120 mv, the gain is exp(−120 mv/26 mv), or 40 dB less.

Figure 2:
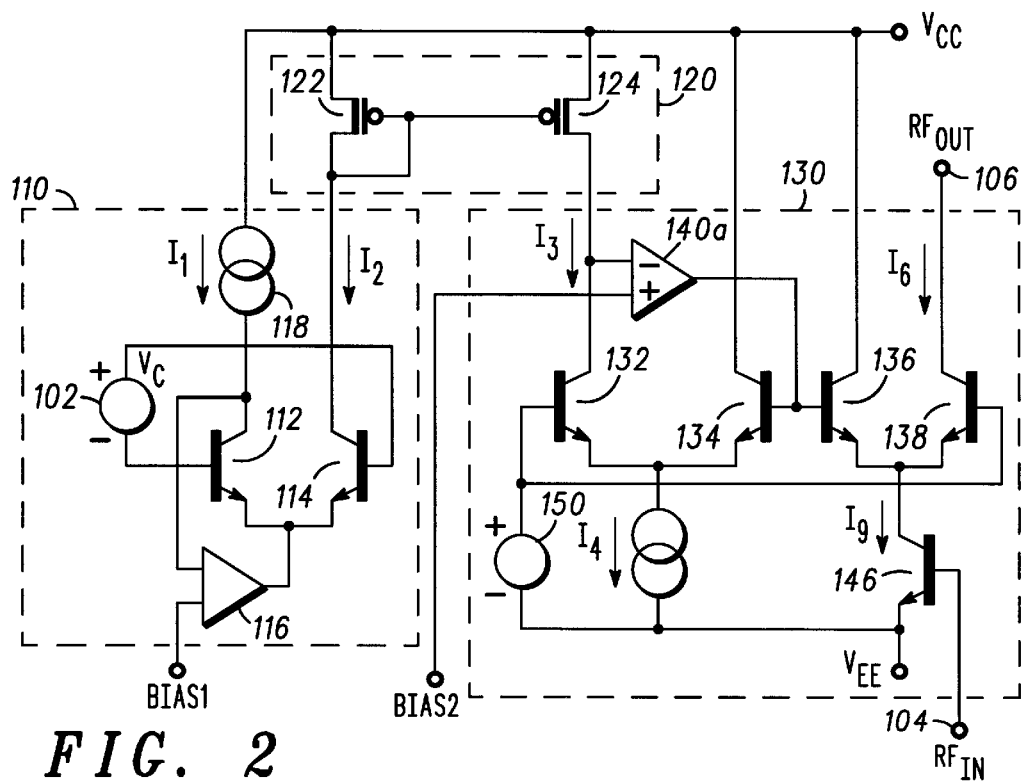
FIG. 2 is a circuit diagram of another embodiment of the present invention.

FIG. 2 shows another embodiment of a logarithmic amplifier 200. It should be pointed out that the same reference numbers are used in the figures to denote the same elements. This embodiment provides for a different biasing scheme in second stage amplifier 130 from the biasing scheme illustrated in FIG. 1. The first stage amplifier 110 and the current mirror stage 120 are configured and operate as in the previous embodiment. The current equations 1–5 set forth above are equally applicable to the embodiment of FIG. 2.

In the embodiment illustrated in FIG. 2, amplifier 140a is an inverting amplifier that is biased by the signal Bias2 rather than by buffer amplifier 140 as shown FIG. 1. The signal Bias2 is supplied to inverting amplifier 140a that provides an output signal to the base of transistors 134 and 136. In this embodiment, reference voltage source 144 has been removed and inverting amplifier 140a provides the drive signal for transistors 134 and 136. It should be noted that the signal at the output of inverting amplifier 140a is an inverted signal compared to the signal generated at the collector of transistor 132. It should be further noted that the signal Bias2 may have the value $V_{cc}$, as well as other values. A voltage source 150 provides a biasing voltage to the base of transistors 132 and 138.

Figure 3:
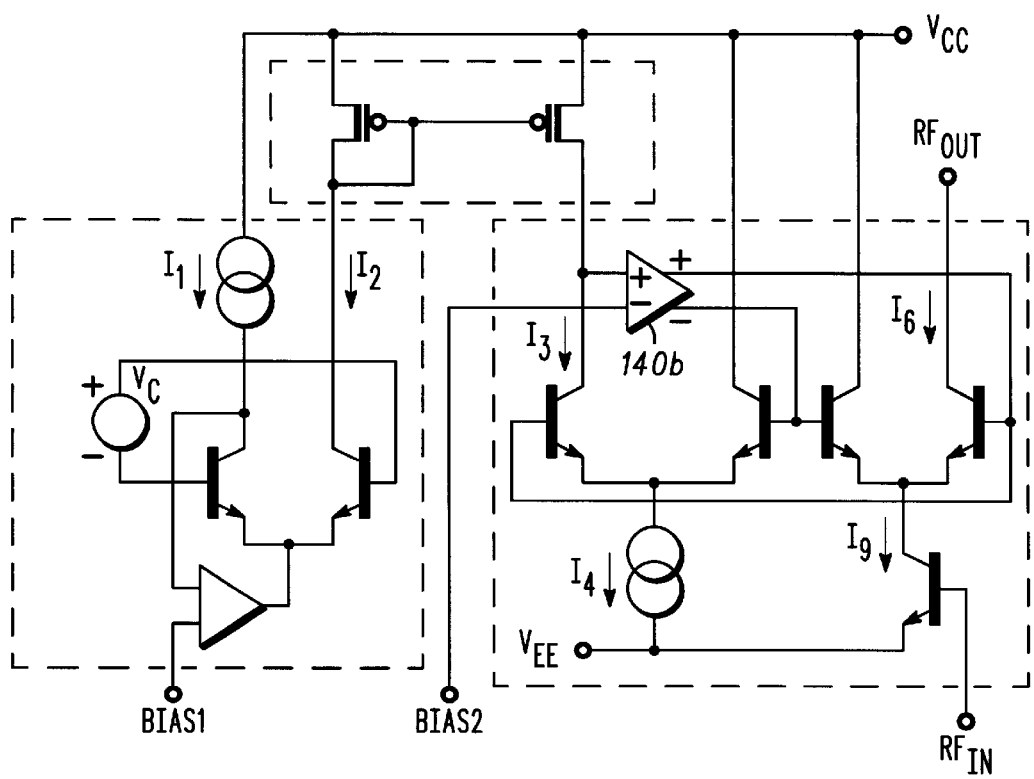
FIG. 3 is a circuit diagram of still another embodiment of the present invention.

FIG. 3 is a schematic diagram that illustrates another embodiment of a logarithmic amplifier 300. This embodiment shows another biasing scheme used in second stage amplifier 130 for controlling the differential transistor pairs, i.e., transistors 132 and 134 and transistors 136 and 138. The voltage source 150 found in FIG. 2 has been removed in this embodiment. Amplifier 140b is a differential amplifier that replaces inverting amplifier 140a (FIG. 2) and generates the biasing voltages for the base of transistors 132, 134, 136 and 138. The first stage amplifier 110 and the current mirror stage 120 are configured and operate the same as in the previous embodiments. The current equations 1–5 set forth above are equally applicable to the embodiment illustrated in FIG. 3.

In this embodiment, the differential amplifier 140b receives the bias signal Bias2 and generates differential output signals. One differential output signal from differential amplifier 140b provides the bias signal for transistors 132 and 138 and the other differential output signal provides the bias signal for transistors 134 and 136. Thus, the voltage sources 144 (FIG. 1) and 150 (FIG. 2) are not necessary in this embodiment. Again, the signal Bias2 may have the value $V_{cc}$, but may have other biasing voltages.

By now it should be appreciated that a logarithmic amplifier has been shown that maintains a logarithmic relationship for a change in a control signal at any gain level up to a maximum gain.

What is claimed is:

1. A logarithmic amplifier, comprising:
   a first current source;
   a first transistor having a base coupled for receiving a first signal, a collector coupled to a first power conductor through the first current source;
   a second transistor having a base coupled for receiving a second signal, a collector, and an emitter coupled to the emitter of the first transistor;
   an amplifier having a first input coupled to the collector of the first transistor, a second input coupled for receiving a bias signal, and an output coupled to the emitters of the first and second transistors;

a first current mirror transistor having a control terminal and a first current carrying terminal coupled to the collector of the second transistor, and a second current carrying terminal coupled to the first power conductor; and a second current mirror transistor having a control terminal coupled to the control terminal of the first current mirror transistor, a first current carrying terminal, and a second current carrying terminal coupled to the first power conductor.

2. The logarithmic amplifier of claim 1, further comprising:

a second current source;

a third transistor having a base coupled for receiving a third signal, a collector coupled to the first current carrying terminal of the second current mirror transistor, and an emitter; and a fourth transistor having a base coupled for receiving a fourth signal, a collector coupled to the first power conductor, and an emitter coupled to the emitter of the third transistor and coupled to a second power conductor through the second current source.

3. The logarithmic amplifier of claim 2, further comprising:

a fifth transistor having a base coupled to the base of the fourth transistor, a collector coupled to the first power conductor, and an emitter; and a sixth transistor having a base coupled to the base of the third transistor, a collector coupled to an output, and an emitter coupled to the emitter of the fifth transistor.

4. The logarithmic amplifier of claim 3, further comprising an amplifier having a first input coupled to the collector of the third transistor, a second input coupled to an output that supplies the third signal to the bases of the third and sixth transistors.

5. The logarithmic amplifier of claim 3, further comprising an inverting amplifier having an inverting input coupled to the collector of the third transistor, a second input coupled for receiving a bias signal, and an output that supplies the fourth signal to the bases of the fourth and fifth transistors.

6. A logarithmic amplifier, comprising:

a current source that provides a first current;

a first differential transistor pair having a first transistor with a collector coupled through the current source to a first power conductor and a second transistor with a collector, and bases that receive a differential signal;

an amplifier having an input coupled to the collector of the first transistor, another input coupled for receiving a bias signal, and an output that supplies a first current to commonly coupled emitters of the first differential transistor pair that causes a second current conducted by the first transistor to match the first current; and a current mirror wherein the current mirror includes, a first current mirror transistor having a control terminal and a first current carrying terminal coupled to the collector of the second transistor, and a second current carrying terminal coupled to the first power conductor, and a second current mirror transistor having a control terminal coupled to the control terminal of the first current mirror transistor, a first current carrying terminal coupled to an output of the current mirror, and a second current carrying terminal coupled to the first power conductor.

7. The logarithmic amplifier of claim 6, further comprising:

a second differential transistor pair having a first transistor with a collector coupled to the output of the current mirror and a second transistor with a collector coupled to the first power conductor, and bases that receive first and second signals; and an amplifier having an input coupled to the collector of the first transistor of the second differential transistor pair, another input coupled for receiving a bias signal, and an output that supplies a signal to a base of the first transistor of the second differential transistor pair.

8. The logarithmic amplifier of claim 7, further comprising a third differential transistor pair having a first transistor with a collector coupled to the first power conductor, a base coupled to a base of the second transistor of the second differential transistor pair, and a second transistor with a collector coupled to an output, and a base coupled to the base of the first transistor of the second differential transistor pair.

9. The logarithmic amplifier of claim 8, further comprising a third transistor with a collector coupled to commonly coupled emitters of the first and second transistors of the third differential transistor pair, a base coupled for receiving an input signal, and an emitter coupled to a second power conductor.

10. The logarithmic amplifier of claim 8, further comprising a second current source coupled between commonly coupled emitters of the first and second transistors of the second differential transistor pair and the second power conductor.

11. A method for producing an output electrical current, comprising the steps of:

generating a first current;

biasing base terminals of first and second transistors of a first differential transistor pair with a differential signal;

comparing a second current into a collector of the first transistor of the first differential transistor pair with the first current; and generating a tail current for commonly coupled emitters of the first and second transistors that cause the first current to be equal to the second current.

12. The method of claim 11, further comprising the step of mirroring a third current conducted by the second transistor of the first differential transistor pair to generate a fourth current.

13. The method of claim 12, further comprising the step of biasing base terminals of first and second transistors of a second differential transistor pair with a signal that causes the fourth current to be conducted by the first transistor of the second differential transistor pair.

14. The method of claim 13, further comprising the step of biasing base terminals of first and second transistors of a third differential transistor pair with the signal and generating a tail current to the emitters in accordance with a radio frequency (RF) signal that causes a ratio of an output current conducted by the second transistor to the tail current to be characterized by a log function of the differential signal.

* * * * *